United States Patent
Hazama et al.

(10) Patent No.: US 8,993,878 B2
(45) Date of Patent: Mar. 31, 2015

(54) ELECTRODE FOR PHOTOVOLTAIC DEVICE

(71) Applicant: Kabushiki Kaisha Toyota Chuo Kenkyusho, Nagakute-shi, Aichi-ken (JP)

(72) Inventors: Hirofumi Hazama, Nagoya (JP); Ryoji Asahi, Miyoshi (JP); Yumi Saiki, Nisshin (JP)

(73) Assignee: Kabushiki Kaisha Toyota Chuo Kenkyusho, Nagakute (JP)

( * ) Notice: Subject to any disclaimer, the term of this patent is extended or adjusted under 35 U.S.C. 154(b) by 0 days.

(21) Appl. No.: 13/961,243

(22) Filed: Aug. 7, 2013

(65) Prior Publication Data

US 2014/0060640 A1    Mar. 6, 2014

(30) Foreign Application Priority Data

Aug. 30, 2012   (JP) ................................. 2012-190531

(51) Int. Cl.
| | |
|---|---|
| H01L 31/0328 | (2006.01) |
| H01L 31/0224 | (2006.01) |
| H01L 31/032 | (2006.01) |
| H01L 31/0392 | (2006.01) |
| H01L 31/072 | (2012.01) |
| H01L 31/0749 | (2012.01) |

(52) U.S. Cl.
CPC .... *H01L 31/022425* (2013.01); *H01L 31/0326* (2013.01); *H01L 31/03923* (2013.01); *H01L 31/072* (2013.01); *H01L 31/0749* (2013.01); *Y02E 10/541* (2013.01)
USPC ............................ 136/256; 136/262; 136/265

(58) Field of Classification Search
CPC .............. H01L 21/0425; H01L 21/043; H01L 31/022425; H01L 31/0322
USPC ............ 136/256, 260, 262, 264, 265; 438/84, 438/85, 86, 94, 95, 98
See application file for complete search history.

(56) References Cited

U.S. PATENT DOCUMENTS 5,626,688 A * 5/1997 Probst et al. ................... 136/265

FOREIGN PATENT DOCUMENTS

| JP | A-08-222750 | 8/1996 |
|---|---|---|
| JP | A-2006-165386 | 6/2006 |
| JP | A-2011-507281 | 3/2011 |
| JP | A-2011-187732 | 9/2011 |
| WO | WO 2009/076690 A2 | 6/2009 |

OTHER PUBLICATIONS

Office Action issued in Japanese Patent Application No. 2012-190531 dated Jun. 24, 2014 (with translation).
Aug. 26, 2014 Office Action issued in Japanese Patent Application No. JP2012-190531 w/translation.

* cited by examiner

*Primary Examiner* — Jayne Mershon
(74) *Attorney, Agent, or Firm* — Oliff PLC (57) ABSTRACT

An electrode for a photovoltaic device includes a Mo layer and a sulfurization-resistant layer formed on the Mo layer. The sulfurization-resistant layer contains at least one element X selected from a group consisting of Nb, Ti, Ta, Au, V, Mn, and W. A molar ratio of the element X to Mo contained in the sulfurization-resistant layer preferably satisfies X/(Mo+X) >about 0.5. A thickness (initial thickness) of the sulfurization-resistant layer before being exposed to sulfurizing atmosphere is preferably about 3 to about 200 nm.

5 Claims, 6 Drawing Sheets

ELECTRODE FOR PHOTOVOLTAIC DEVICE

FIELD OF THE INVENTION

The present invention relates to an electrode for a photovoltaic device, and particularly relates to an electrode preferably used as a back electrode (bottom electrode) of a photovoltaic device having a light absorbing layer including a sulfide-based compound semiconductor.

BACKGROUND OF THE INVENTION

The photovoltaic device refers to a device that can convert photon energy into electric signals through a certain physical phenomenon (photovoltaic conversion). Solar cells, which are a type of photovoltaic device, can efficiently convert the energy of solar rays into electrical energy.

Single-crystal Si, polycrystalline Si, amorphous Si, GaAs, InP, CdTe, $CuIn_{1-x}Ga_xSe_2$ (CIGS), and $Cu_2ZnSnS_4$ (CZTS) are known as the semiconductors used for the solar cells.

Among them, the chalcogenide compounds typified by CIGS and CZTS can each be formed into a cost-advantageous thin film due to the large light absorption coefficient thereof. In particular, a solar cell with CIGS as a light absorbing layer has relatively high conversion efficiency among thin-film solar cells, and has exhibited conversion efficiency higher than that of a polycrystalline-Si solar cell. In addition, CZTS has a bandgap energy (1.4 to 1.5 eV) suitable for solar cells, and characteristically contains no environment load element and no rare element.

The thin-film solar cell generally has a structure where a back electrode, a light absorbing layer, a buffer layer, a window layer, and a top electrode are provided in this order on a substrate. In the thin-film solar cell, a junction between the light absorbing layer and the back electrode affects conversion efficiency. In the thin-film solar cell having a light absorbing layer including a sulfide such as CZTS, Mo is typically used for the back electrode. However, a Mo sulfide layer is formed on a Mo surface in a process for forming a stacked structure of the light absorbing layer including the sulfide and the Mo electrode (for example, heat treatment in sulfur atmosphere or sputtering of a sulfide onto the Mo surface). The Mo sulfide layer causes an increase in series resistance, leading to reduction in conversion efficiency.

To solve such a problem, various proposals have been made. For example, Patent Literature 1 discloses a sulfide thin-film device produced by (1) forming a nickel-silicon binary mixed film, in which a compositional ratio of Si is 50%, by a co-sputtering process on a soda lime glass (SLG) substrate,
(2) forming a copper-zinc-tin thin film by a co-sputtering process on the binary mixed film, and
(3) heating the substrate at 500 to 570° C. under coexistence of sulfur.

In addition, Patent Literature 1 describes that
(a) a crystal of $Cu_2ZnSnS_4$ and a crystal of NiSi are generated through the heating, and
(b) while a Mo film is extremely increased in resistance value after sulfurization, a NiSi alloy film shows almost no increase in resistivity even after sulfurization for 60 min.

Patent Literature 2 discloses a method of forming a back electrode of a thin-film solar cell, which, however, is not intended to improve sulfurization resistance of the back electrode, the method including:

(1) forming a mixture of Mo powder and powder of Ti, Zr, Hf, V, Nb, Ta, or W in a proportion of 0.1 to 45 at % into a circular blank by die pressing and hot isostatic pressing, and machining the circular blank into a sputtering target, and
(2) forming the back electrode using the sputtering target.

In addition, Patent Literature 2 describes that long-term durability of the back electrode is improved (i.e., corrosion of the back electrode due to diffusive intrusion of oxygen or permeation of water is suppressed) by adding Ti and/or other elements to Mo.

Furthermore, Patent Literature 3 discloses a CIS-based thin-film solar cell, which, however, is not intended to improve sulfurization resistance of the back electrode, the CIS-based thin-film solar cell being produced by:

(1) forming an alkali-free silica layer on soda lime glass,
(2) forming a metal back electrode including Mo, Ti, Ta, or the like having corrosion resistance against selenium on the silica layer, and
(3) forming a p-type CIS-based light absorbing layer, a high-resistance buffer layer, and an n-type window layer on the back electrode.

Patent Literature 3 describes that formation of the alkali-free silica layer on the soda lime glass can prevent excessive thermal diffusion of alkaline components from the soda lime glass into the light absorbing layer.

As described in Patent Literature 1, NiSi alloy has higher sulfurization resistance than that of Mo. The NiSi alloy, however, has resistivity at least one order of magnitude higher than that of Mo, and is thus less likely to be a good electrode material.

On the other hand, Patent Literature 2 discloses the back electrode including Mo to which Ti and/or other elements are added. The back electrode described in Patent Literature 2, however, includes Mo as a main component. Hence, the back electrode possibly has low sulfurization resistance while being less oxidized.

CITATION LIST

Patent Literature

[Patent Literature 1] Japanese Unexamined Patent Application Publication No. 2011-187732.
[Patent Literature 2] Japanese Unexamined Patent Application Publication (Translation of PCT Application) No. 2011-507281.
[Patent Literature 3] Japanese Unexamined Patent Application Publication No. 2006-165386.

SUMMARY OF THE INVENTION

The problem to be solved by the present invention is to provide an electrode for a photovoltaic device, the electrode being capable of suppressing an increase in series resistance due to sulfurization.

To solve the above-described problem, an electrode for a photovoltaic device according to the present invention is summarized by including a Mo layer, and a sulfurization-resistant layer formed on the Mo layer, the sulfurization-resistant layer containing at least one element X selected from a group consisting of Nb, Ti, Ta, Au, V, Mn, and W.

The sulfurization-resistant layer containing the predetermined element X is provided on the No layer, thereby sulfurization of the Mo layer is suppressed. A possible reason for this is as follows. That is, during exposure of the electrode to sulfurizing atmosphere (for example, during formation of a sulfide-based compound semiconductor on the sulfurization-resistant layer), the element X contained in the sulfurization-resistant layer is selectively sulfurized or oxidized by remaining oxygen, or the sulfurization-resistant layer suppresses diffusion of S. Moreover, since the element X is a metal element, an increase of electric resistance is smaller compared with a case where a sulfurization-resistant layer containing a semimetal element such as Si is provided.

DETAILED DESCRIPTION OF THE PREFERRED EMBODIMENTS

Hereinafter, one embodiment of the present invention will be described in detail.

[1. Electrode for Photovoltaic Device]

An electrode for a photovoltaic device according to the present invention includes a Mo layer and a sulfurization-resistant layer.

[1.1. Mo Layer]

In the present invention, the Mo layer configures a major part of the electrode. Mo advantageously has low sheet resistance and good adhesiveness to a glass substrate.

Thickness of the Mo layer can be appropriately selected for each purpose without limitation. Specifically, the Mo layer may be a thin film, or may have a thickness large enough to be self-supported. The thin-film Mo layer is typically provided on a substrate. The thin-film Mo layer preferably has a thickness of 500 nm to 5 μm.

In the case where the Mo layer is formed on a substrate, various materials may be used for the substrate for each purpose without limitation.

Examples of the materials for the substrate include:

(1) glass, for example, SLG, low-alkali glass, non-alkali glass, quartz glass, Na-ion implanted quartz glass, and sapphire glass, (2) ceramics, for example, oxides such as silica, alumina, yttria, and zirconia, and various ceramics containing Na, and (3) metal, for example, stainless steel, Na-containing stainless steel, Au, Mo, and Ti.

Among them, glass is inexpensive and good in adhesion to the Mo layer, and is therefore preferred as a material for the substrate.

[1.2. Sulfurization-Resistant Layer]

The sulfurization-resistant layer contains at least one element X selected from a group consisting of Nb, Ti, Ta, Au, V, Mn, and W. The sulfurization-resistant layer may contain only the element X, or may additionally contain other elements. Examples of the other elements include O, N, C, and Mo. A smaller amount of Mo is more preferred since Mo adversely affects sulfurization-resistance.

The sulfurization-resistant layer may be configured of a single layer containing one element X or at least two elements X, or may be configured of two or more stacked layers containing the same element X or different elements X.

The element X is:

(a) an element forming no sulfide (for example, Au), or (b) an element forming a sulfide and an oxide each being stable and low in electric resistance, and acting as a sulfurization-resistant barrier that slows sulfur diffusion. Hence, when the sulfurization-resistant layer containing the element X as a main component is provided between the Mo layer and the light absorbing layer, sulfurization of the Mo layer can be suppressed during formation of the light absorbing layer.

Even if Mo is not intentionally added during formation of the sulfurization-resistant layer, Mo may be mixed or diffused into the sulfurization-resistant layer depending on manufacturing processes.

If Mo is contained in the sulfurization-resistant layer, the sulfurization-resistant layer shows lower sulfurization resistance with an increase in Mo content. Hence, a molar ratio of the element X to Mo contained in the sulfurization-resistant layer preferably satisfies $X/(Mo+X) >$ about 0.5. The molar ratio of the element X more preferably satisfies $X/(Mo+X) \geq$ about 0.6, further preferably satisfies $X/(Mo+x) \geq$ about 0.7, and further preferably satisfies $X/(Mo+X) \geq$ about 0.8.

If the sulfurization-resistant layer is configured of two or more stacked layers containing different elements X, at least one layer should satisfy the above-described molar ratio condition for the element X.

The thickness (initial thickness) of the sulfurization-resistant layer, which has not been exposed to sulfurizing atmosphere, affects series resistance of the photovoltaic device. If the initial thickness is extremely small, S is diffused to the Mo layer during formation of the light absorbing layer, resulting in formation of a Mo sulfide layer on a surface of the Mo layer. The initial thickness is preferably about 3 nm or more in order to suppress an increase in series resistance. More preferably, the initial thickness is about 5 or more, and further preferably about 10 nm or more.

On the other hand, even if the initial thickness is increased more than necessary, no significant effect, i.e., no benefit is provided. Hence, the initial thickness is preferably about 200 nm or less. The initial thickness is more preferably about 100 nm or less, further preferably about 50 nm or less, and further preferably about 30 nm or less.

A photovoltaic device, having a light absorbing layer including a sulfide-based compound semiconductor, is generally manufactured by forming a precursor of the sulfide-based compound semiconductor on a surface of a back electrode (bottom electrode), and sulfurizing the precursor. In the case where the electrode for a photovoltaic device according to the present invention is used as the back electrode, the sulfurization-resistant layer is also exposed to sulfurizing atmosphere during sulfurization of the precursor, leading to an increase in thickness of the sulfurization-resistant layer. The swelling amount of the sulfurization-resistant layer varies depending on types of the element X, initial thickness, and sulfurization conditions.

For example, in the case where the initial thickness of the sulfurization-resistant layer is about 3 to about 100 nm, the thickness of the sulfurization-resistant layer subjected to sulfurization is about 5 to about 550 nm.

[1.3. Applications]

The electrode for a photovoltaic device according to the present invention can be used for various applications. In particular, the electrode is preferably used as the back electrode of the photovoltaic device having a light absorbing layer including a sulfide-based compound semiconductor.

Examples of the sulfide-based compound semiconductor include:
(1) $Cu(In, Ga)(S, Se)_2$, $Cu_2ZnSn(S, Se)_4$, SnS, $Cu_xS$, $FeS_2$, $Cu_2SnS_3$, and $Cu_xZn_yS$, and
(2) materials each being prepared by adding any appropriate dopant to each of the materials listed in (1).

The thickness of the light absorbing layer can be optimally selected for each purpose without limitation.

The photovoltaic device may further include any of components other than the substrate, the back electrode (the Mo layer and the sulfurization-resistant layer), and the light absorbing layer.

For example, the thin-film solar cell generally has a structure where the substrate, the back electrode, the light absorbing layer, a buffer layer, a window layer, and a top electrode are stacked in this order. An additional layer may be provided between the respective layers.

Specific examples of the additional layer include:
(1) an adhesive layer for improving adhesion between the substrate and the back electrode,
(2) a light scattering layer provided near the top electrode with respect to the light absorbing layer, the light scattering layer reflecting incident light to improve light absorption efficiency of the light absorbing layer,
(3) a light scattering layer provided near the substrate with respect to the light absorbing layer, and
(4) an anti-reflection layer that reduces reflection of incident light by the window layer to improve light absorption efficiency of the light absorbing layer.

In the present invention, any of various materials can be used for each layer for each purpose without limitation.

In the case where the photovoltaic device is a solar cell, specific materials for each of layers other than the light absorbing layer include the following materials.

Examples of materials for the buffer layer include CdS.

Examples of materials for the window layer include ZnO:Al, ZnO:Ga, ZnO:B, In—Sn—O, In—Zn—O, $SnO_2$:Sb, and $TiO_2$:Nb.

Examples of materials for the top electrode include Al, Cu, Ag, Au, and alloys containing at least one of such metals. Specific examples of such alloys include Al—Ti alloy, Al—Mg alloy, Al—Ni alloy, Cu—Ti alloy, Cu—Sn alloy, Cu—Zn alloy, Cu—Au alloy, Ag—Ti alloy, Ag—Sn alloy, Ag—Zn alloy, an Ag—Au alloy.

In the case where a glass substrate is used as the substrate, examples of materials for the adhesive layer include Ti, Cr, Ni, and W and alloys containing at least one of such metals.

Examples of materials for the light scattering layer provided above the light absorbing layer include oxides such as $SiO_2$ and $TiO_2$, and nitrides such as Si—N.

Examples of materials for the light scattering layer provided near the substrate with respect to the light absorbing layer include a layer having an irregular surface.

Examples of materials for the anti-reflection layer include a transparent body having a refractive index smaller than that of the window layer, an aggregate configured of transparent particles each having a diameter sufficiently smaller than a certain wavelength of sunlight, a material having inside spaces each having a diameter sufficiently smaller than a certain wavelength of sunlight, and a material having a concave/convex structure in a sub-micrometer period on its surface. Specific examples of such materials include:
(1) a thin film including $MgF_2$, $SiO_2$, or the like,
(2) a multilayer film including oxide, sulfide, fluoride, and nitride, and
(3) fine particles including oxide such as $SiO_2$.

[2. Method of Manufacturing Electrode for Photovoltaic Device]

The electrode for a photovoltaic device according to the present invention can be manufactured by forming the sulfurization-resistant layer on a surface of the Mo layer.

[2.1. Mo layer Preparation Step]

First, the Mo layer is prepared. The Mo layer may have a thickness large enough to be self-supported, or may be a thin film formed on a substrate surface.

The thin-film Mo layer can be formed by any of various processes without limitation. Specific examples of the method of manufacturing the Mo layer include a sputtering process, a vacuum deposition process, a pulse laser deposition (PLD) process, a plating process, a chemical bath deposition (CBD) process, an electrophoretic deposition (EPD) process, a chemical vapor deposition (CVD) process, a spray pyrolysis deposition (SPD) process, a screen printing process, a spin coating process, and a nanoparticle deposition process.

[2.2. Sulfurization-Resistant Layer Formation Step]

Then, a sulfurization-resistant layer containing an element X is formed on the Mo layer. The sulfurization-resistant layer may contain one of the above-described elements X, or may contain two or more of the elements X. Details of the sulfurization-resistant layer and of the element X are as described above, and description thereof is omitted.

The sulfurization-resistant layer can be formed by any of various processes without limitation. Details of the formation process of the sulfurization-resistant layer are similar to those of the formation process of the thin-film Mo layer, and description thereof is omitted.

[2.3. Other Steps]

As described above, after formation of the sulfurization-resistant layer on the Mo layer, the light absorbing layer and other layers are formed as necessary. Examples of the layers other than the light absorbing layer include the buffer layer, the window layer, and the top electrode. The layers other than the light absorbing layer can each be formed by any of various processes without limitation. Details of the formation process of each of the layers other than the light absorbing layer are similar to those of the formation process of the sulfurization-resistant layer, and description thereof is omitted.

[3. Effect]

Figure 1:
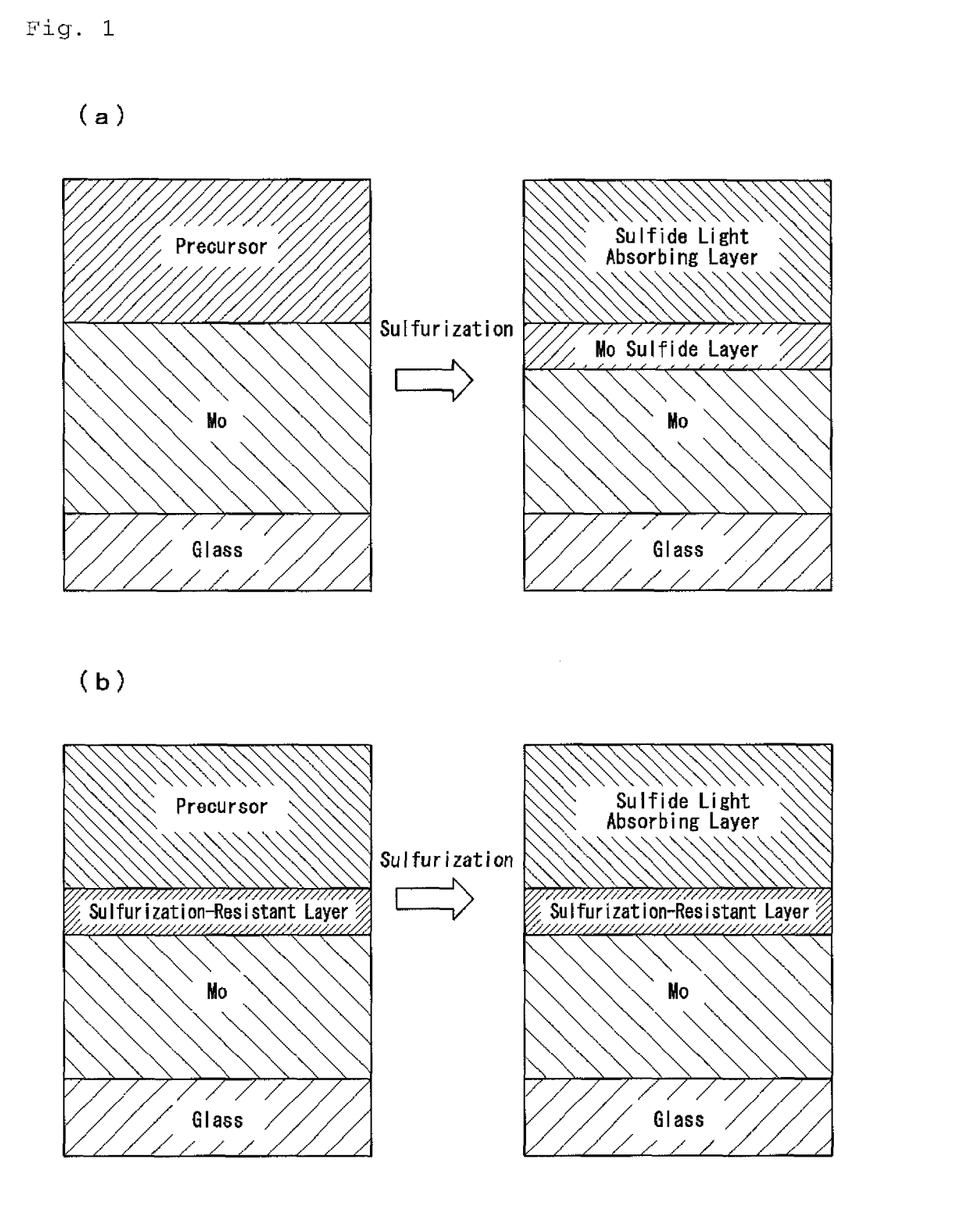
FIG. 1A is a schematic diagram of a traditional solar cell having Mo as a back electrode.
FIG. 1B is a schematic diagram of a solar cell having an electrode according to the present invention as a back electrode.

FIG. 1A illustrates a schematic diagram of a traditional solar cell having Mo as aback electrode. FIG. 1B illustrates a schematic diagram of a solar cell having the electrode according to the present invention as a back electrode.

As illustrated in FIG. 1A, a No layer and a precursor are formed in this order on a glass substrate. Then, the precursor is sulfurized and is thus formed into a sulfide light absorbing layer. Along with this, a Mo sulfide layer is formed in an interface between the Mo layer and the light absorbing layer. As a result, series resistance of the solar cell increases.

In contrast, as illustrated in FIG. 13, the sulfurization-resistant layer containing a predetermined element X is provided in an interface between the Mo layer and the light absorbing layer (precursor), thus resulting in suppression of sulfurization of the Mo layer. A possible reason for this is as follows. That is, during sulfurization of the precursor of the sulfide-based compound semiconductor, the precursor being formed on the sulfurization-resistant layer, the element X contained in the sulfurization-resistant layer is selectively sulfurized or is oxidized by remaining oxygen, or the sulfurization-resistant layer suppresses diffusion of S. Moreover, since the element X is a metal element, an increase of electric resistance is smaller compared with a case where the sulfurization-resistant layer containing a semimetal element such as Si is provided.

The electrode, in which the sulfurization-resistant layer containing the element X is provided on the surface of the Mo layer, has high sulfurization resistance and low electric resistance, and is thus preferably used as an electrode material for photovoltaic devices such as a sulfide-based solar cell. Use of such an electrode decreases series resistance component, and therefore the solar cell is promisingly improved in fill factor (FF) or current density.

EXAMPLES

Example 1

[1. Sample Preparation]

A Mo layer (1 μm in thickness) is formed on a glass substrate by a sputtering process. Then, a sulfurization-resistant layer, having an initial thickness of 3 to 100 nm, is formed on the Mo layer by an electron beam (EB) vapor deposition process (for Ti) or a sputtering process (for any element X other than Ti). The sulfurization-resistant layer is formed of one of Nb, Ti, Ta, Au, V, Mn, W, and Pt. The substrate is not heated during the deposition. Then, sulfur is heated at 150° C. at an upstream side in nitrogen flow, so that the surface of the sulfurization-resistant layer is sulfurized at 580° C. for 30 min.

[2. Test Method]

[2.1. Sheet Resistance]

Figure 2:
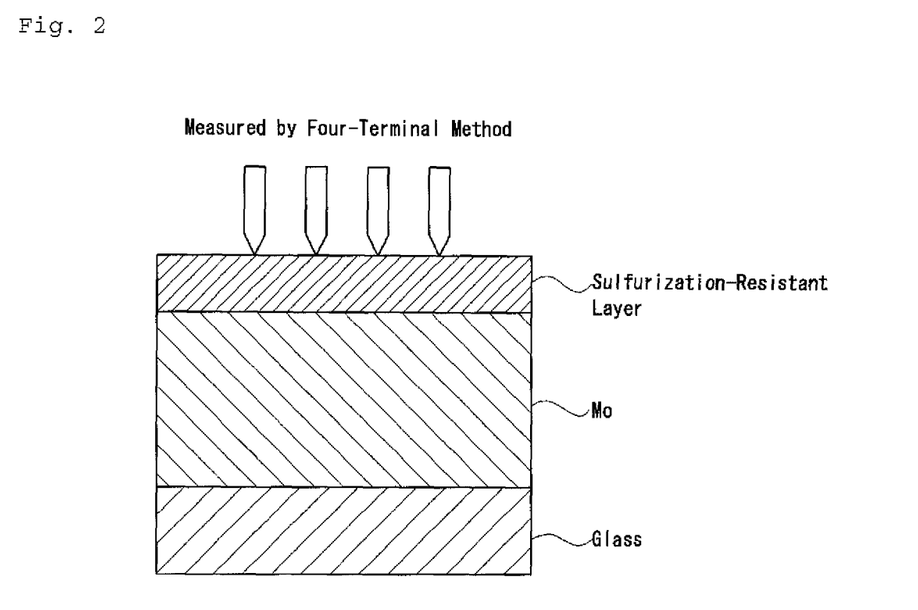
FIG. 2 is a schematic diagram illustrating a method of measuring sheet resistance.

As illustrated in FIG. 2, sheet resistance is measured by a four-terminal method.

[2.2. Photon Spectra]

Figure 4:
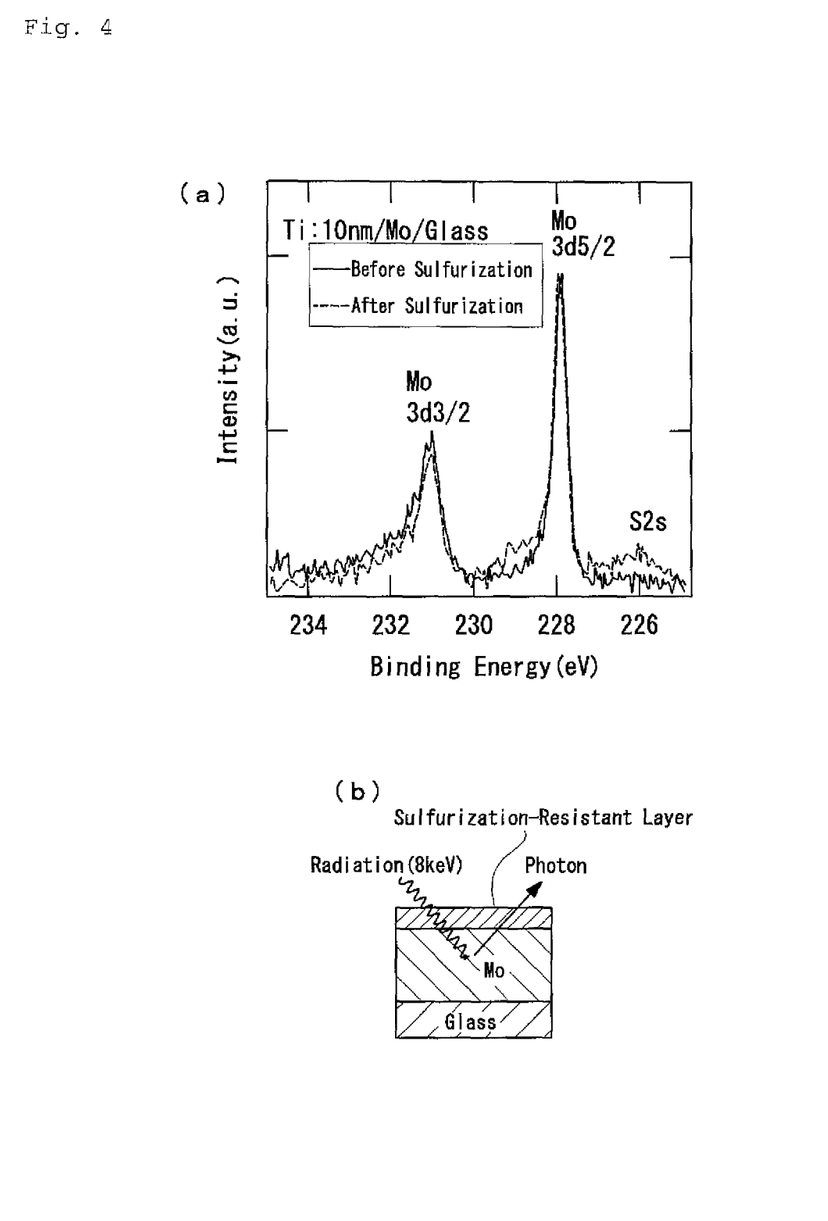
FIG. 4A is a diagram illustrating photon spectra of a stack of Ti (10 nm)/Mo/glass before and after sulfurization.
FIG. 4B is a schematic diagram illustrating a method of measuring the photon spectra.

As illustrated in FIG. 4B, hard X-ray (8 eV) is applied onto the sulfurization-resistant layer so that photons are emitted, and spectra of the photons are measured.

[2.3. Auger Electron Spectroscopy]

Compositional distribution in a depth direction is measured by Auger electron spectroscopy.

[3. Results]

[3.1. Sheet Resistance]

Figure 3:
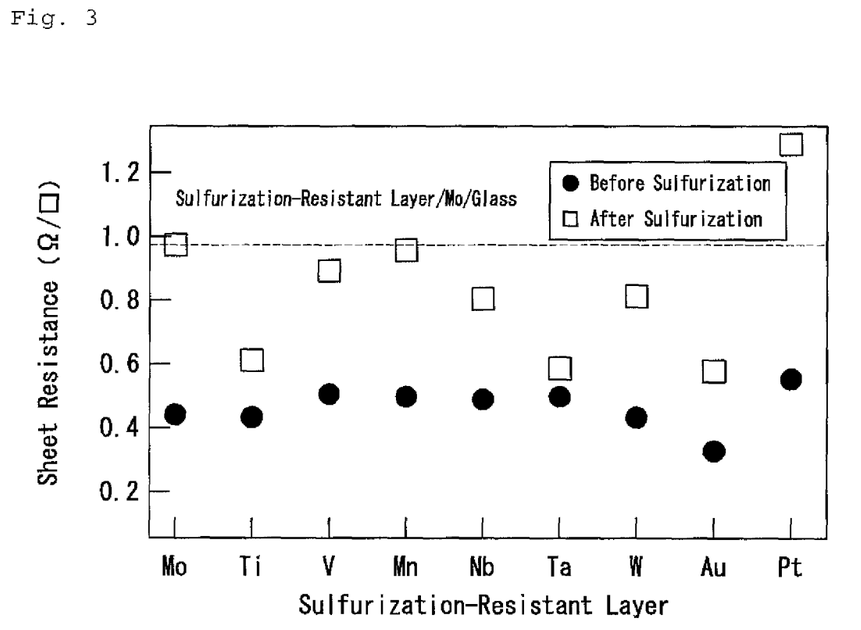
FIG. 3 is a diagram illustrating sheet resistance before and after sulfurization of each of electrodes including sulfurization-resistant layers (each having an initial thickness of 100 nm) formed of various elements X.

FIG. 3 illustrates sheet resistance before and after sulfurization of each of the electrodes including sulfurization-resistant layers (each having an initial thickness of 100 nm) formed of various elements X. FIG. 3 teaches the following:

(1) While sheet resistance of a stack of No/glass is 0.442 Ω/sq before sulfurization, the sheet resistance increases to 0.977 Ω/sq after sulfurization. This is because a Mo sulfide layer is formed on a Mo surface through the sulfurization process.

(2) If sheet resistance after sulfurization of a stack of sulfurization-resistant layer/Mo/glass is lower than 0.977 Ω/sq, such lower sheet resistance means that series resistance after sulfurization is lowered by the interposed sulfurization-resistant layer. Specifically, if the sulfurization-resistant layer is formed of one of Nb, Ti, Ta, Au, V, Mn, and W, series resistance is lowered compared with a case of the stack of Mo/glass without the sulfurization-resistant layer.

[3.2. Photon Spectra]

FIG. 4A illustrates photon spectra before and after sulfurization of a stack of Ti (10 nm)/Mo/glass.

In the stack including the Ti layer having an initial thickness of 10 nm, no shift of the 3 d peak of Mo occurs even after sulfurization. This means that Ti prevents sulfurization of the underlying Mo.

[3.3. Auger Electron Spectroscopy]

Figure 5:
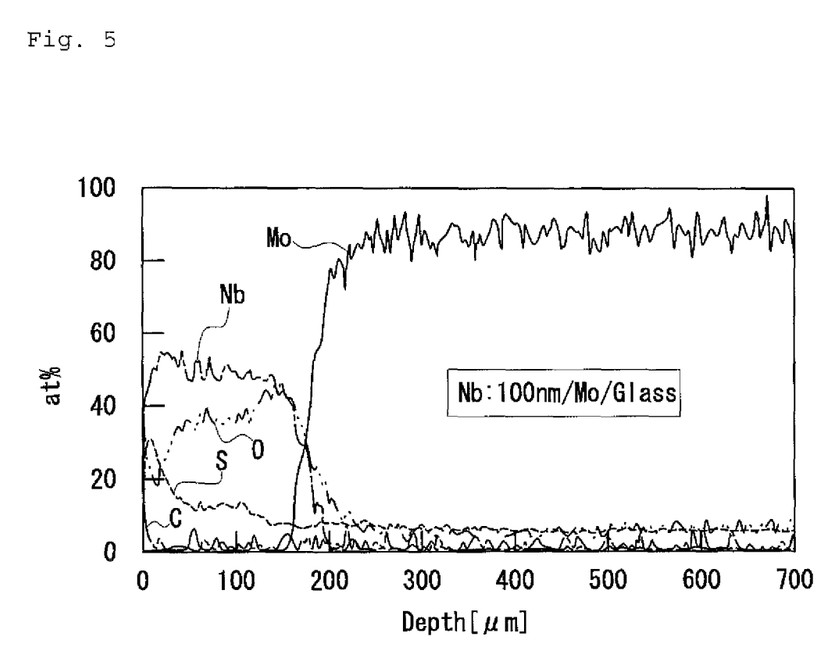
FIG. 5 is a diagram illustrating compositional distribution in a depth direction, which is determined by Auger electron spectroscopy, of a stack of Nb (100 nm)/Mo/glass after sulfurization.
Figure 6:
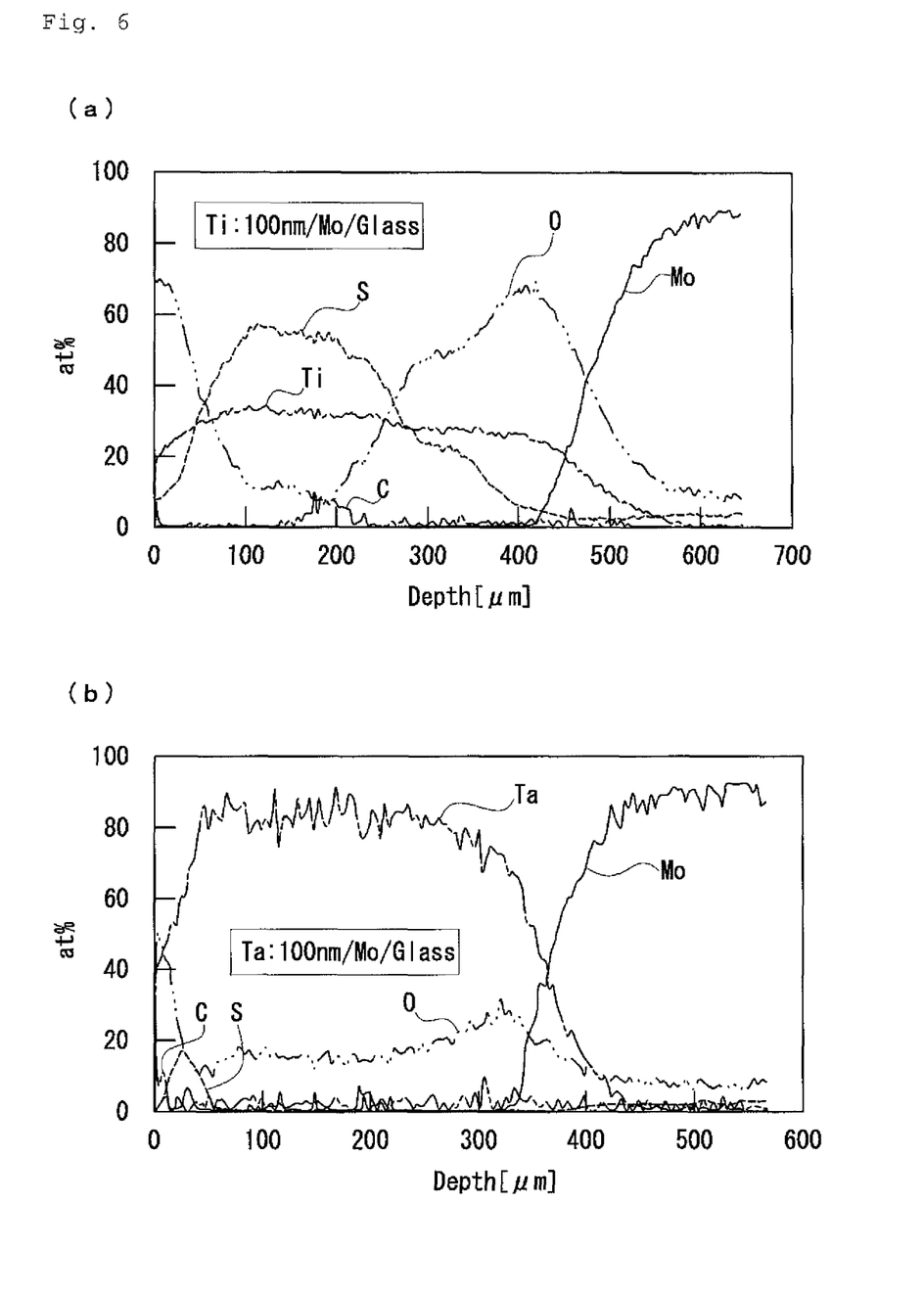
FIG. 6 is a diagram illustrating compositional distribution in a depth direction, which is determined by Auger electron spectroscopy, of a stack of Ti (100 nm)/Mo/glass (FIG. 6A) and a stack of Ta (100 nm)/Mo/glass (FIG. 6B) after sulfurization.

FIG. 5 illustrates compositional distribution in a depth direction of a stack of Nb (100 nm)/Mo/glass after sulfurization. FIG. 6 illustrates compositional distribution in a depth direction, which is determined by Auger electron spectroscopy, of a stack of Ti (100 nm)/Mo/glass (FIG. 6A) and a stack of Ta (100 nm)/Mo/glass (FIG. 6B) after sulfurization. FIGS. 5, 6A and 6B teach the following.

(1) In a sulfurization-resistant layer formed of Ti, Nb, or Ta, which has an initial thickness of 100 nm, diffusion of S into the Mo layer is suppressed.

(2) The sulfurization-resistant layer swells upon exposure to sulfurizing atmosphere. The amount of such swelling varies depending on types of the element X. The thickness of the sulfurization-resistant layer subjected to sulfurization is defined as "length from a surface to an inside region satisfying $X/(Mo+X) \geq 0.5$". Thus, in the stack of Ti (100 nm)/Mo/glass, the sulfurization-resistant layer subjected to sulfurization has a thickness of 450 nm, which is 4.5 times as large as the initial thickness.

(3) Similarly, in the stack of Nb (100 nm)/Mo/glass, the sulfurization-resistant layer subjected to sulfurization has a thickness of 170 nm, which is 1.7 times as large as the initial thickness. In the stack of Ta (100 nm)/Mo/glass, the sulfurization-resistant layer subjected to sulfurization has a thickness of 360 nm, which is 3.6 times as large as the initial thickness.

Figure 7:
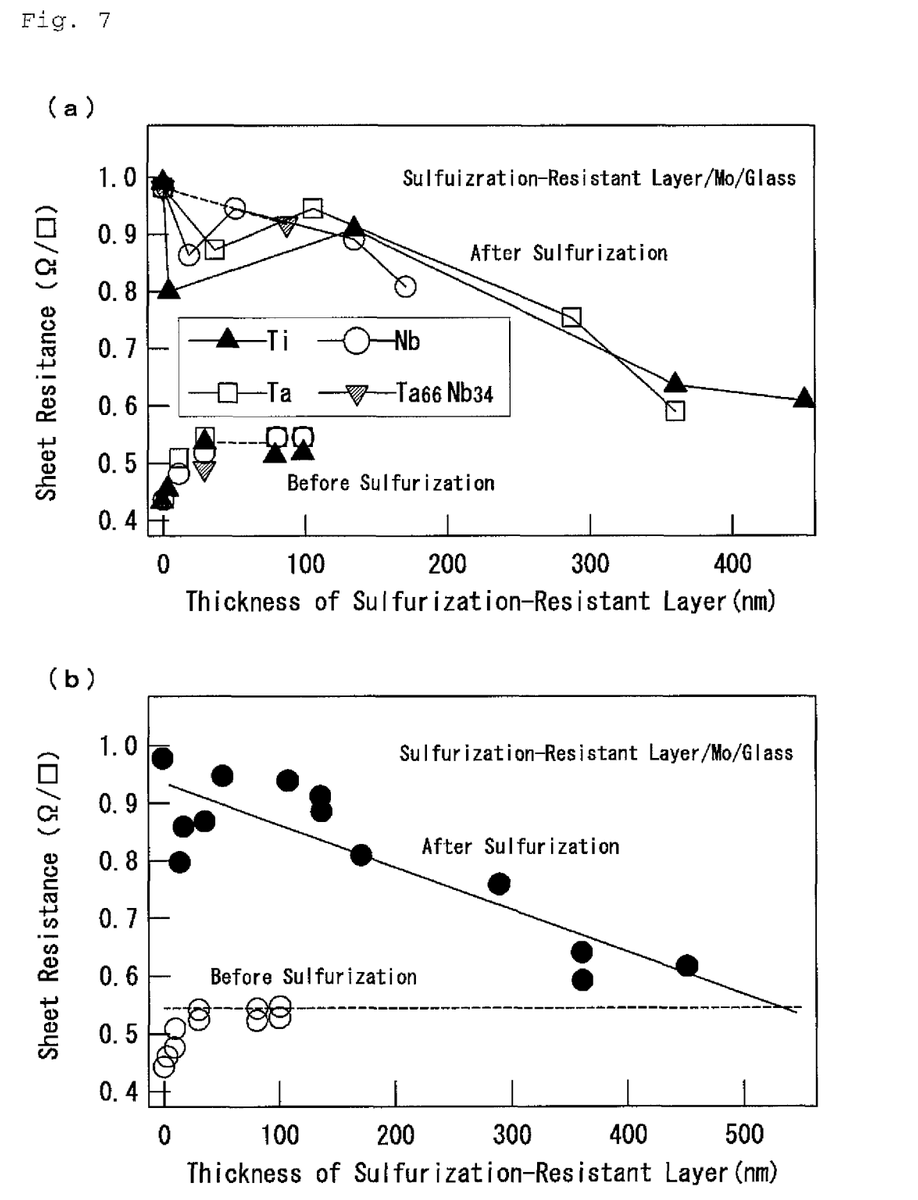
FIGS. 7A and 7B are diagrams illustrating relationships between thicknesses of a sulfurization-resistant layer before and after sulfurization and sheet resistances, where there is a distinction between the elements X in FIG. 7A, while there is no distinction between the elements X in FIG. 7B.

FIGS. 7A and 7B illustrate relationships between thicknesses of the sulfurization-resistant layer before and after sulfurization and sheet resistances, where there is a distinction between the elements X in FIG. 7A, while there is no distinction between the elements X in FIG. 7B. FIGS. 7A and 7B teach the following:

(1) The swelling amount of the thickness of the sulfurization-resistant layer subjected to sulfurization varies depending on types of the element X. However, the thickness and the sheet resistance of the sulfurization-resistant layer subjected to sulfurization correlate with each other regardless of the types of the element X. Specifically, the sheet resistance decreases with an increase in the thickness after sulfurization regardless of the types of the element X. On the other hand, the sheet resistance before sulfurization has a fixed value in a thickness (initial thickness) range of 30 nm or more.

(2) The sheet resistances before and after sulfurization correspond to each other at the thickness of the sulfurization-resistant layer subjected to sulfurization of about 530 nm. Even if the thickness after sulfurization is increased to more than 530 nm, series resistance rather increases in correspondence to such increased thickness (in other words, the sheet resistance is not lower than the sheet resistance before sulfurization), and therefore no benefit is given.

(3) In the case of the initial thickness of 3 nm, the sulfurization-resistant layer is also effective for reduction in sheet resistance.

(4) In the case where the sulfurization-resistant layer is $Ta_{66}Nb_{34}$ formed by co-sputtering of Nb and Ta, the sheet resistance after sulfurization is on a correlation line between the sheet resistances and the thicknesses of the sulfurization-resistant layers each including a single element X.

Although one embodiment of the present invention has been described in detail hereinbefore, the present invention should not be limited to the above-described embodiment, and various modifications and alterations may be made within the scope without departing from the gist of the present invention.

The electrode for a photovoltaic device according to the present invention can be used as a back electrode of a sulfide-based solar cell.

What is claimed is:

1. An electrode for a photovoltaic device, comprising:
   a Mo layer; and
   a sulfurization-resistant layer formed on the Mo layer, wherein:
   the sulfurization-resistant layer contains Mo and at least one element X selected from a group consisting of Nb, Ta, Au, V, Mn, and W, and
   a molar ratio of the element X to the Mo contained in the sulfurization-resistant layer satisfies X/(Mo+X)>about 0.5.

2. The electrode according to claim 1, wherein an initial thickness of the sulfurization-resistant layer before being exposed to a sulfurizing atmosphere is about 3 to about 200 nm.

3. The electrode according to claim 2, wherein a thickness of the sulfurization-resistant layer after being exposed to a sulfurizing atmosphere is about 5 to about 550 nm.

4. The electrode according to claim 1, wherein the electrode is used as a back electrode of a photovoltaic device having a light absorbing layer including a sulfide-based compound semiconductor.

5. The electrode according to claim 4, wherein the sulfide-based compound semiconductor comprises one of $Cu(In, Ga)(S, Se)_2$, $Cu_2ZnSn(S, Se)_4$, $SnS$, $Cu_xS$, $FeS_2$, $Cu_2SnS_3$, and $Cu_xZn_yS$.

* * * * *